United States Patent [19]

Klaiber

[11] 4,013,466
[45] Mar. 22, 1977

[54] METHOD OF PREPARING A CIRCUIT UTILIZING A LIQUID CRYSTAL ARTWORK MASTER

[75] Inventor: Robert James Klaiber, Hopewell Township, Mercer County, N.J.

[73] Assignee: Western Electric Company, Inc., New York, N.Y.

[22] Filed: June 26, 1975

[21] Appl. No.: 590,766

[52] U.S. Cl. .................................. 96/36; 96/36.2; 96/27 E; 96/27 R; 96/38.4; 350/160 LC

[51] Int. Cl.² ...................... G03C 5/00; G03C 5/04

[58] Field of Search ............ 96/36, 36.2, 44, 27 R, 96/27 E, 38.4; 350/160 LC; 29/577

[56] References Cited

UNITED STATES PATENTS

| | | | |
|---|---|---|---|
| 3,404,451 | 10/1968 | So | 29/577 |
| 3,722,998 | 3/1973 | Morse | 350/160 LC |
| 3,758,207 | 9/1973 | Letzer | 350/160 LC |
| 3,771,218 | 11/1973 | Langdon | 96/36.2 |
| 3,796,999 | 3/1974 | Kahn | 350/160 LC |
| 3,836,243 | 9/1974 | Melchior | 350/160 LC |

Primary Examiner—Won H. Louie, Jr.
Attorney, Agent, or Firm—J. Rosenstock

[57] ABSTRACT

A method of forming a circuit mask is disclosed. The method comprises selectively heating a portion of a cell comprising a liquid crystal above the transition temperature of the liquid crystal material to render the portion capable of scattering a desired radiant energy. An artwork master is thus formed having a pattern delineated therein capable of transmitting the desired radiant energy therethrough. A member having a surface sensitive to the desired radiant energy is positioned in a desired spatial relationship with the master. The master is exposed to the desired radiant energy whereby the radiant energy is transmitted through the pattern to expose at least a portion of the sensitive surface thereto. The exposed sensitive surface is treated to form the circuit mask having a pattern capable of transmitting light therethrough.

12 Claims, 4 Drawing Figures

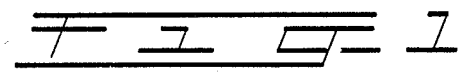
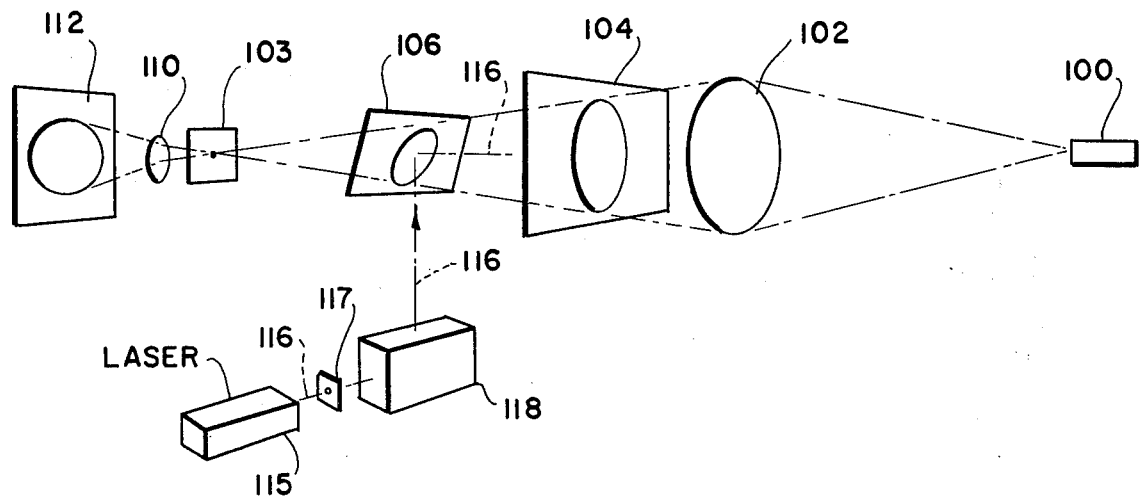
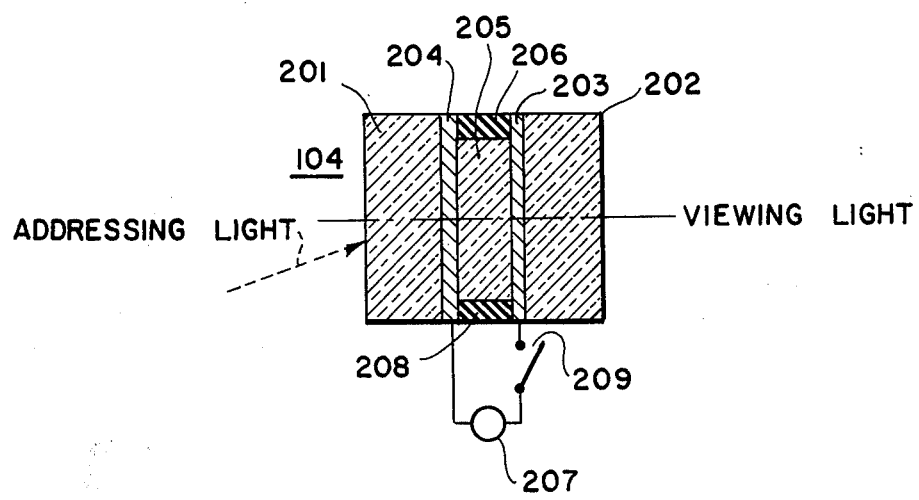

METHOD OF PREPARING A CIRCUIT UTILIZING A LIQUID CRYSTAL ARTWORK MASTER

BACKGROUND OF THE INVENTION

1. Field of the Invention

This invention relates to a method of forming a circuit mask and more particularly, to a method of forming the mask by means of a refreshable artwork master comprising a liquid crystal cell.

2. Discussion of the Prior Art

In the manufacture of printed circuits and integrated circuits (microcircuit patterns), increased and stringent demands have been made on the width and accuracy of the pattern delineated, e.g., conductor patterns of printed circuit boards. Conventional techniques of generating enlarged scale artwork by taping or cutting are not accurate enough for the present needs of both printed circuit board and microcircuit manufacture. Currently, very sophisticated systems are employed requiring a great number of various interconnecting patterns. Recently, computerized, electromechanically driven artwork generators have been employed which eliminate most accuracy problems. Usually masters are prepared by such computerized pattern generators, such as emulsion on glass masters, which are permanent and which have to be stored and indexed and which are not readily adaptable to pattern modification. This is a problem since the generation of printed circuit patterns, as well as microcircuit patterns, requires adaptation to changing sizes, configurations and degrees of complexity. There are no computerized (or other) pattern generator systems presently capable of rapid response to changes in size, configuration and/or degrees of complexity whereby a refreshable master is generated. By a refreshable master is meant a master which can be rapidly altered, as by addition thereto or subtraction therefrom, to yield a new and different master having a different pattern contained therein.

Recently, liquid crystal compositions and apparatus have received wide interest in the field of display systems, such as in advertisement devices, temperature indicating devices and so forth. However, it had not heretofore been thought that such compositions and apparatus, such as used for graphics or alpha-numeric displays, could be employed for accurate projection display, such as that required for printed and microcircuit pattern generation, because of the poor contrast and resolution of the patterns projected thereby.

A number of prior art arrangements include means for "writing" on a liquid crystal cell by inducing light scattering regions in otherwise clear liquid crystals. In particular, in a well-known arrangement, the cell includes a photoconductive layer, the impedance of which changes in relation to the intensity of light incident on it. During the writing mode, an electric potential is maintained across the liquid crystal substance and photoconductive layer of the cell. At the point of incidence of the light beam on the cell, the impedance of the photoconductive layer, and hence the voltage across it, decreases, thereby increasing the voltage drop across the liquid crystal. The resulting increase in voltage across the liquid crystal produces scattering areas within the liquid crystal. Such an arrangement is described, for example, in an article entitled, "Reversible Ultraviolet Imaging with Liquid Crystals" by J. D. Margerum et al., appearing in *Applied Physics Letters*, Vol. 17, pages 51–53, July 15, 1970. See also G. H. Conners et al., U.S. Pat. No. 3,592,527, issued July 13, 1971.

In addition, it is known to use a laser beam as the light source to alter the resistance characteristics of the photoconductive layer. The typical configuration in which such cells, containing a photoconductive layer, are used further includes a source of projection light for projecting an image on a display surface.

However, it is a characteristic of the mentioned photoconductive materials that they alter the optical characteristics of the system. In particular, these materials typically absorb a range of frequencies of the projection light shone on them, thus causing a degenerative effect on the projected image. Special precautions often involving expensive and intricate apparatus must therefore be used to avoid these degenerative effects. The precautionary measures often result in inefficient use of the projection light yielding an image having poor resolution.

The prior art liquid crystal cells are generally of either the transmissive type, in which scattered projection light passes through the entire cell, or the reflection type, in which the projection light is reflected from an internal surface. The images projected in the prior art arrangements exhibiting the transmissive mode are typically characterized by dark writing on an orange or, at best, pale yellow background, depending on the substances used. Contrast is even more difficult to obtain when the reflection mode is used primarily because of spurious reflection at the substrate surfaces. Further, it is difficult to fabricate reflecting layers which reflect a significant amount of projection light while, at the same time, providing efficient electrical conduction in a direction perpendicular to the plane of the reflecting layer, or, stated differently, minimizing undesirable current flow in the plane of the reflecting layer.

As discussed above, printed circuit and microelectronic circuit pattern delineation require high-feature density. The feature density is usually specified in terms of smallest linewidth divided into largest pattern dimension. This number varies between 5000 and 15000 for thin film, printed wiring board, multilayer board and integrated circuit patterns. Conventional display systems, e.g., graphics displays, alpha-numeric displays, while quite satisfactory for those applications cannot meet the space-bandwidth product number, given above, which is required for circuit patterns, and have never, heretofore, been employed for forming a circuit mask or for forming circuit patterns in any manner.

A pattern generator having a refreshable artwork master comprising a liquid crystal cell from which an image can be projected with high resolution and contrast is therefore desired.

SUMMARY OF THE INVENTION

This invention relates to a method of forming a circuit mask and more particularly, to a method of forming the mask by means of a refreshable artwork master comprising a liquid crystal cell.

The method comprises selectively heating a portion of a cell comprising a liquid crystal above the transition temperature of the crystal to render the portion capable of scattering a desired radiant energy to form an artwork master having a pattern delineated therein capable of transmitting the desired radiant energy therethrough. A member having a surface sensitive to the desired radiant energy is positioned in a desired spatial relationship with the master. The master is exposed to the desired radiant energy to transmit the radiant energy through the pattern to expose at least a portion of the sensitive surface thereto. The exposed sensitive surface is treated to form a pattern capable of transmitting radiant energy therethrough to form the circuit mask.

DESCRIPTION OF THE DRAWING

The present invention will be more readily understood by reference to the following drawing taken in conjunction with the detailed description, wherein:

FIG. 1 is a diagram of a projection system of the present invention;

FIG. 2 is a cross-sectional view of a liquid crystal display cell for use in the projection system of FIG. 1;

DETAILED DESCRIPTION

Figure 3:
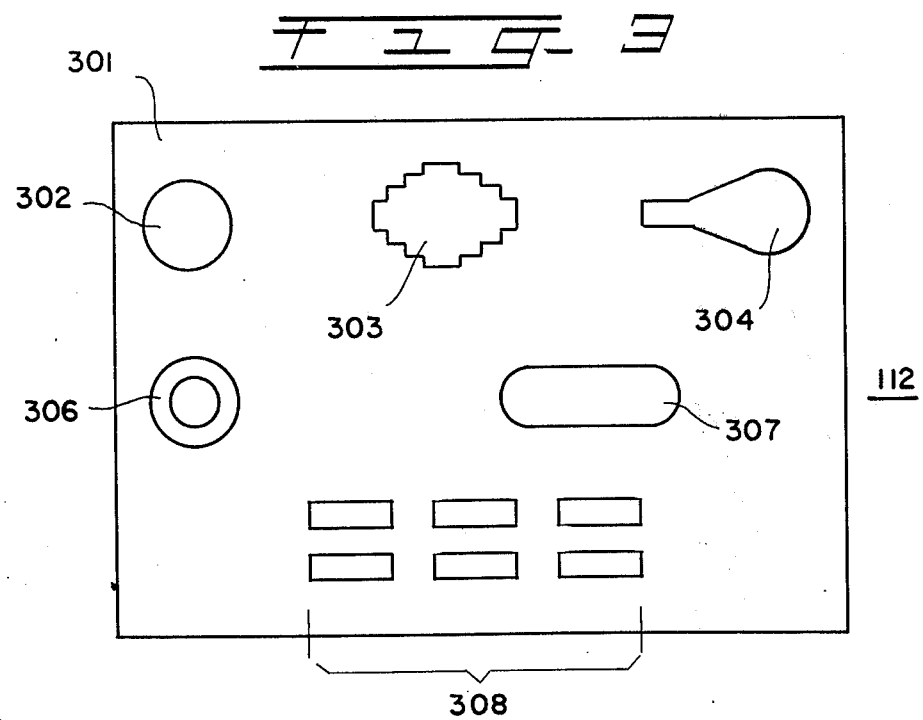
FIG. 3 is a plan view of a developed sensitized member of the system of FIG. 1.

The present invention comprises a technique for forming a circuit mask employing an infrared laser addressing arrangement and a liquid crystal cell operating in the transmission mode. The cell includes two erasing electrodes for heating selected areas of the liquid crystal beyond a transition temperature to produce long-lasting, light-scattering regions and for erasing those light scattering regions. U.S. Pat. Nos. 3,796,999 and 3,836,243, incorporated hereinto by reference, describe liquid crystals which are suitable for the present invention.

FIG. 1 shows a projection system employed in the present invention. A source of viewing radiant energy or light 100, illustratively a 150 watt xenon arc lamp, emits light which is focused by a condenser lens 102 such that the light is passed through a projection lens 110. Lens 102 focuses the light so that the light converges at a Schlieren aperture plate 103 which blocks any scattered light. The non-scattered light passes through plate 103 onto a suitable radiant energy or light-sensitive member 112.

A suitable light-sensitive member 112 for fabricating circuit patterns and circuit masks is one having a light or radiant energy sensitive surface, e.g., a visible light sensitive surface. Typically, member 112 comprises a conventional photographic emulsion plate (silver halide emulsions supported on a suitable base). Other suitable light-sensitive members are well known in the photolithographic art, including but not limited to a metal base having a radiant energy sensitive, e.g., ultraviolet light sensitive, photoresist layer thereon. It is, of course, understood that although the present invention is described in terms of transmitting visible light it is not to be restricted thereby and the light or radiation sensitive surface, e.g., a photoresist coated surface, may be adapted to the particular radiation transmitted to it.

A liquid crystal cell 104 is positioned between lens 102 and lens 110 so that an image defined by light-scattering regions in cell 104 will be projected onto member 112. It is, of course, to be understood that the optical system, namely lenses 102 and 110 may be selected so that the image projected may be either enlarged or reduced as is well known to those skilled in the art. Cell 104 is a liquid crystal cell constructed to operate in the transmissive mode. A reflecting surface 106, situated between lens 110 and cell 104, is transparent to light from source 100.

FIG. 2 illustrates liquid crystal cell 104 for use in the projection arrangement of the present invention as shown in FIG. 1. Cell 104 of FIG. 2 includes transparent support substrates 201 and 202 typically made of quartz, glass or any other suitable material. Adjacent to support substrates 201 and 202 are electrodes 203 and 204, and sandwiched between electrodes 203 and 204 is a liquid crystal material 205.

FIG. 2 depicts a typical cell in cross section. Spacers 206 and 208, which extend around the periphery of cell 104 form a cavity with electrodes 203, 204 and adjacent substrates 201, 202 for containing liquid crystal material 205. Spacers 206 and 208 typically comprise polyethylene terephthalate, e.g., "Mylar," a trademarked product of E. I. DuPont de Nemours, or similar material exhibiting low electrical conduction and high dielectric strength. Electrodes 203 and 204 are in close electrical and thermal contact with liquid crystal material 205.

In a preferred embodiment, cell 104 includes two fused quartz support substrates (201, 202) with a layer (not shown) of indium tin oxide, $In_{2-x}Sn_xO_{3-y}$, deposited on each substrate to form heat-producing electrodes 203, 204. These indium tin oxide electrodes are sputter-deposited on substrates 201, 202 which are maintained above 500° C. in an oxygen-deficient environment during sputtering, e.g., as described in the Abstract, entitled "Highly Conductive Transparent Films of Sputtered Indium Oxide-Tin Oxide" by D. B. Fraser et al., appearing in *The Electrochemical Society Extended Abstracts*, Washington, D.C., May 1971. Electrodes produced in this manner are of the order of 2,000 to 10,000 Angstroms thick and exhibit good light transmission properties at visible wavelengths with little scattering. Further, the electrodes have a sufficiently high carrier density to absorb light by free-carrier absorption in the 0.8 to 1.6μm wavelength range. Liquid crystal material 205, sandwiched between the electrode-deposited surfaces of quartz substrates 201 and 202, preferably comprises a smectic liquid crystal material comprising N-(p-cyanobenzylidene)-p-n octylaniline or "CBOA," which is typically of the order of less than 15 microns in thickness. However, it is to be understood that any liquid crystal material which can be selectively light patterned to form a light scattering pattern, e.g., a visible light scattering pattern, which can be selectively or partially erased (eliminated) may be employed. One such liquid crystal material includes a cholosteric mixture comprising N-(p-Methoxy Benzylidene)-p-Butylaniline with approximately 10 percent by weight of cholesteryl nonanoate.

In accordance with the preferred cell arrangement, coherent addressing light shone on liquid crystal cell 104 of FIG. 2, and illustrated by the arrow designated "addressing light" in FIG. 2, passes through cell 104 from left to right. It is understood that the terms "coherent light" and "laser light," used interchangeably throughout the subject application, mean a narrow beam of laser light. In particular, substrate 201 transmits essentially all of the incident light through it, as does substrate 202. A portion of the addressing beam is absorbed, however, by heat-producing electrode layers 203 and 204. This absorbed radiation stimulates the electrode layers to produce heat. The heat thus generated is advantageously arranged to heat liquid crystal material 205 between the stimulated areas of electrodes 203 and 204 to a temperature sufficient to transform liquid crystal substance 205, as for example CBOA from the smectic to the isotropic state. That is the liquid crystal is transformed from a state in which the molecules thereof are essentially all aligned in parallel and transmit radiant energy or light, e.g., visible light, to a state in which the molecules are randomly aligned (non-parallel) and scatter radiant energy, e.g., visible light. This transition temperature for the preferred CBOA liquid crystal material 205 is approximately 72° Centigrade. The addressing beam is then removed and liquid crystal material 205 of cell 104 is cooled to below 72° C, thereby preserving the light scattering pattern or areas in liquid crystal material 205.

In addition, a source of a-c voltage 207 is advantageously connected to heat-generating (erasing) electrodes 203 and 204 by means of switch 209. When switch 209 in FIG. 2 is closed, the voltage from source 207 is applied to electrodes 203 and 204 (erasing layers). Specifically, an AC voltage with a frequency higher than the relaxation frequency of liquid crystal material 205 applied across liquid crystal material 205 removes any scattering areas between electrodes 203 and 204. As is well known in the art, the dielectric relaxation frequency is advantageously equal to $\sigma/2\pi D$, where $\sigma$ is the conductivity in (ohm-centimeters)$^{-1}$ of the liquid crystal substance, $D = \epsilon\epsilon_0, \epsilon$ is the dielectric constant of the liquid crystal substance and $\epsilon_0 = 8.86 \times 10^{14}$ farad/centimeter, the dielectric constant of free space. Illustratively, an erasing voltage having a magnitude of the order of 8 to 40 V peak-to-peak and a frequency of the order of 10 to 20 kHz is convenient to erase the scattering centers of a layer of the CBOA liquid crystal material of the order of up to 15 microns thick.

Referring again to FIG. 1, the projection system includes a suitable source of laser radiation 115 which produces a beam of coherent laser light. In particular, laser source 115 is arranged to generate a beam of laser radiation designated 116 in FIG. 1. Since the indium tin oxide is transparent to visible (projection) light and absorbs laser light in the infrared region, i.e., light of a wavelength in the range from 0.8$\mu$m to 1.3$\mu$m, suitable laser sources typically include a gallium arsenide (GaAs) laser source, emitting light of a wavelength of 0.9$\mu$m, an yttrium aluminum garnet (YAG) laser source (1.06 m) and the 1.15$\mu$m emission line of a helium neon (HeNe) laser. Additionally, since indium tin oxide absorbs light in the ultraviolet range, ultraviolet laser sources such as a helium cadmium source emitting light having a wavelength of 0.325$\mu$m or a krypton laser source emitting light having a wavelength of 0.35$\mu$m are also suitable for use in the arrangement of FIG. 1 for addressing cell 104.

Laser beam 116, in this typical embodiment, is controlled in a standard fashion by a conventional modulator 117. Beam 116 is further controlled by conventional control apparatus 118. Control apparatus 118 typically includes galvanometer movable mirrors (not shown) for redirecting laser beam 116 to intersect reflecting surface 106. Such control apparatus are well known in the art and will not be elaborated herein. Reflecting surface 106 typically is a dichroic mirror which reflects laser light (in the infrared region) but transmits viewing light.

Clearly, from FIG. 1, it is apparent that the point of incidence of laser beam 116 on inclined reflecting surface 106 determines the point on liquid crystal cell 104 to be intersected by and, hence, addressed by laser beam 116. Thus, by changing the angle of deflection of the mirrors of control apparatus 118, for example, any point on the image area of liquid crystal cell 104 can be addressed by laser beam 116. Further, by continuously changing the angle of deflection of the control mirrors, the laser beam can be continuously moved about the image area of cell 104.

A smectic crystal, for example CBOA at temperatures ranging from 25° C up to 72° C, is normally in a bound liquid crystal state in which the molecules are arranged in parallel planes which permit the passage of radiant energy or light, e.g., visible light, with virtually no light scattering. However, some portions of the liquid crystal may have molecules which have assumed a random (non-parallel) alignment which scatter radiant energy or light, e.g., visible light, directed therethrough. Therefore these randomly aligned portions must initially be aligned in a parallel fashion. Referring to FIGS. 1 and 2, in operation in order to present an initially uniform ordered state of liquid crystal material 205 of cell 104, that is a uniform visible light transmitting smectic state, liquid crystal material 205 of liquid crystal cell 104 is initially erased overall, i.e., cell 104 is initially scanned over its entire surface with coherent laser beam 116 from laser source 115. Simultaneously with this scanning, switch 209 (FIG. 2) is closed and a voltage is applied between electrodes 203 and 204, thereby creating a uniform smectic liquid crystal cell 104.

The uniform smectic cell 104 occurs because local areas of the liquid crystal substance 205 contained in cell 104 are raised into the free state (unbounded state) when infrared laser beam 116 scans over them and electrodes 203 and 204 absorb enough thermal energy from beam 116 to heat the adjacent local liquid crystal areas above the transition temperature of the liquid crystal, e.g., 72° C for CBOA. When the electric field at a suitable voltage, e.g., 11 volts AC at 10 kHz, is established between electrodes 203 and 204, the molecules of the liquid crystal align themselves perpendicular to the electric field (parallel to each other). When beam 116 has passed, the local areas of liquid crystal material 205 of cell 104 return to below the transition temperature, e.g., 72° C for CBOA, and the ordered smectic state (non-light scattering state) is preserved or bound in the crystal.

A pattern, corresponding to a desired circuit pattern, destined to be projected on radiant energy or light sensitive member 112 is then delineated, as by writing on liquid cell 104 which is to function as an artwork master. In order to produce the desired pattern, laser source 115, e.g., a focused 20 milliwatt YAG infrared laser, provides a beam 116, typically having a focused cross section of approximately 15 microns, directed through modulator 117 and controlled by control means 118 onto a selected portion of cell 104. Beam 116 scans liquid crystal cell 104 at a suitable velocity, typically of about 25 centimeters per second. During this scanning, laser source 115 is directed by control means 118 so that laser beam 116 selectively scans only those portions of liquid crystal material 205 of cell 104 which are to be written in with the desired pattern. As discussed above, upon exposure to laser beam 116 the local areas of liquid crystal 205 exposed will be heated above its transition temperature, e.g., 72° C for CBOA, into a free state which becomes randomly oriented if no external field is present, e.g., an electric field, and upon passage of beam 116 are cooled into a frozen, randomly oriented bound state which scatters visible light. Those portions of the liquid crystal 205 not exposed to beam 116 will remain in the ordered smectic state and will transmit visible light.

In delineating the circuit pattern on cell 104 it may be necessary to locally erase portions of previously written-in areas thereof. In order to locally erase or remove certain selected portions of the previously written-in pattern, liquid crystal material 205 of cell 104 is subjected to a second scan by laser source 115 (or by a different laser, not shown) at least at those portions of liquid crystal material 205 of cell 104 at which it is desired to provide the local erase of the previously written portions. Of course, those portions of crystal material 205 of cell 104 which are already in the ordered (non-scattering) smectic state can also be scanned with the erasing laser scan, and these portions will remain in the desired optical non-scattering state. Switch 209 (FIG. 2) is closed both during the erase scan with laser source 115 and during the immediately subsequent cooling, thereby simultaneously applying an AC voltage from source 207 (typically, for example, of about 35 volts at about 20 kHz) across cell 104. This application of the electric field from AC source 207 can also be, of course, synchronized with the erasing laser scan. Those portions to be erased and which are thus scanned are heated above the transition temperature of crystal material 205 and the molecules thereof are transformed from the bound to the free state. The simultaneous application of the external field, i.e., the electric field, transforms these portions from a randomly oriented state to an ordered state whereby light is not scattered thereby.

At this point, it is to be pointed out that all pattern generators, including a liquid crystal system are limited in speed by (a) the time required to go from one address point to the next and (b) the smallest separation of address points. However, the liquid crystal pattern generator described herein does not have to access addresses one point at a time. The linewidth of the pattern generated on cell 104 is a function of the power of laser source 115. By virtue of this fact, it is apparent that circuit or pattern paths of varying width can be generated by broad brush "painting," i.e., by addressing many points simultaneously without sacrifice of positional accuracy. This gives a tremendous speed advantage over other methods and generators in the generation of printed circuit and/or microcircuit patterns.

It is to be pointed out and stressed hereat that owing to the ability of the crystal pattern generator, described herein, to vary the linewidth of a generated pattern, it is possible to produce a wide range of non-Manhattan (non-rectangular) geometries, which are required for example in the fabrication of printed circuit boards, at a small fraction of the time required by other pattern generators (minutes as compared to hours).

Areas in which the crystal molecules have assumed the random alignment will scatter visible light focused on cell 104. Areas in which the alignment is parallel will transmit visible light without scattering. When projected in a limited aperture optical system, the scattering sites become dark areas that provide contrasts typically of 20:1 with the clear areas.

It is, of course, understood that alternatively the liquid crystal contained in cell 104 may initially be rendered into random molecular alignment (light scattering) and then subsequently exposed to laser source 115 and beam 116 in the presence of an external electrical field to create an ordered light transmitting pattern thereby delineating the desired pattern.

After the desired pattern is obtained on cell 104, viewing light 100 is energized and directed towards cell 104. As mentioned, reflecting surface 106 is transparent to viewing light 100 (visible light) and directed viewing light is therefore transmitted through surface 106. When the viewing light strikes cell 104, those portions thereof which have been written on by or exposed to the laser beam are in a disoriented state and therefore scatter the light. Those areas not exposed to the laser beam are oriented and therefore transmit the light. The transmitted light passes through aperture plate 103 and the scattered light is blocked by aperture plate 103. The transmitted light then passes through projection lens 110 which projects and either enlarges or reduces the pattern of light passing therethrough. The light pattern then falls on the surface of light sensitive member 112 destined to function as a circuit mask. As stated previously, when projected in this fashion, the scattered light sites become dark areas that provide contrasts typically of 20:1 with the clear sites. The sensitive member 112, e.g., a photographic emulsion plate, a chromium deposited glass plate having a photoresist layer thereon, is selectively sensitized whereby a pattern corresponding to the desired circuit pattern is delineated thereon. The exposed member 112 is then treated, e.g., by development of a photographic emulsion, etching of a photoresist delineated exposed surface, etc., whereby a permanently delineated pattern corresponding to the circuit pattern is obtained and a circuit mask is produced. Of course, the resultant circuit mask, e.g., a photographic mask, may be either a positive or negative of the image of the desired circuit pattern to be ultimately fabricated.

It is of course, understood that cell 104 must be maintained within the temperature range defining the desired liquid crystal phase, e.g., the smectic phase (except those portions or regions being addressed). This may be accomplished by judicious choice of a source of projection light.

It is to be pointed out and stressed hereat again that circuit and microcircuit pattern delineation requires high feature density usually specified in terms of smallest linewidth divided into largest pattern dimension. For printed circuit and microcircuit patterns, this number (space-bandwidth product number) varies between 5000 and 15000. In order to obtain the proper space-bandwidth product, liquid crystal cell 104 should be (1) greater than 1 inch wide by 1 inch in length and/or (2) should have a thickness of less than 15 microns. If cell 104 is less than one inch by one inch or if cell 104 is greater than 15 microns then the possibility of producing high feature density of acceptable quality is impaired.

As stated above, the liquid crystal pattern generator described herein can vary the linewidth of a generated pattern to produce a wide range of non-Manhattan geometries at a small fraction of the time required by other generators (minutes as compared to hours). In this regard, reference is made to FIG. 3 which depicts an illustrative, treated as by being developed, sensitized member 112 containing an area 301 through which a desired radiation will pass and a plurality of geometric areas 302 through 304, 306 through 308, through which a desired radiation will not be transmitted. A circular land area or geometry 302 in member 112 is rapidly produced. Referring back to FIG. 1, the land area 302 is produced by simply and rapidly pulsing, e.g., applying 10 milliwatts of power in 7 milliseconds on beam 116 of laser 115. Due to the rotational symmetry of beam 116 a circle is rapidly written in liquid crystal cell 104. Upon projection onto a light or radiation sensitive surface, and development thereof, as described previously, member 112 is formed having land area 302. In contrast, all other laser pattern generators produce polygonal shaped land areas 303 instead of circular land areas such as area 302. Polygonal land areas are generally undesirable because of the possibility of too close a proximity to adjacent features of a desired circuit pattern and more importantly, because of the growth of a feature during a subsequent metal plating at the sharp corners of the polygonal pattern which can cause shorts.

Area 304 of element 112 (FIG. 3) is a keyhole-shaped area which can be produced in cell 104 of FIG. 1 by first increasing the power of laser beam 116, e.g., from 10 milliwatts to 20 milliwatts, while traversing cell 104. Again, this can be rapidly done yielding a desired rounded shape as compared to other pattern generators which cannot yield the rounded end of the keyhole. Area 306 (FIG. 3) represents a disconnect area which can be produced in cell 104 of FIG. 1 by first pulsing, e.g., 20 milliwatts of power in 7 milliseconds, on beam 116 of laser 115, to produce a circular land configuration and then reducing the power, e.g., from 20 milliwatts to 10 milliwatts of beam 116, and erasing the center thereof, the erasing being as described previously. This is a very fast operation which will not produce a polygonal shape as other pattern generators do. An elongated land area 307 (FIG. 3) is also easily produced by initially forming the elongated pattern in cell 104 of FIG. 1 by increasing the power of beam 116, e.g., from 10 milliwatts to 20 milliwatts, and then traversing beam 116 across cell 104 for a short period of time, e.g., typically 50 milliseconds for an area 0.020 inch by 0.250 inch. Finally, an array 308 of rectangular (Manhattan) land areas (FIG. 3) can be produced by generating parallel stripes in cell 104 of FIG. 1 with beam 116 followed by erasure of portions of the stripes thus produced in an orthogonal direction.

With respect to element 112, it is, of course, understood that patterns 302 to 304, 306 to 308 may be produced from cell 104 of FIG. 1 by first traversing the entire surface area of cell 104 with beam 116 to produce a uniform light scattering cell. The cell can then be written upon by selective erasure thereof. Thus for patterns of high "negative fill," i.e., requiring a small amount of clear feature space in an otherwise dark field (projected) or light scattering field, the speed advantage of the subject invention described herein is an enormous one which is difficult to duplicate by other pattern generators.

Figure 4:
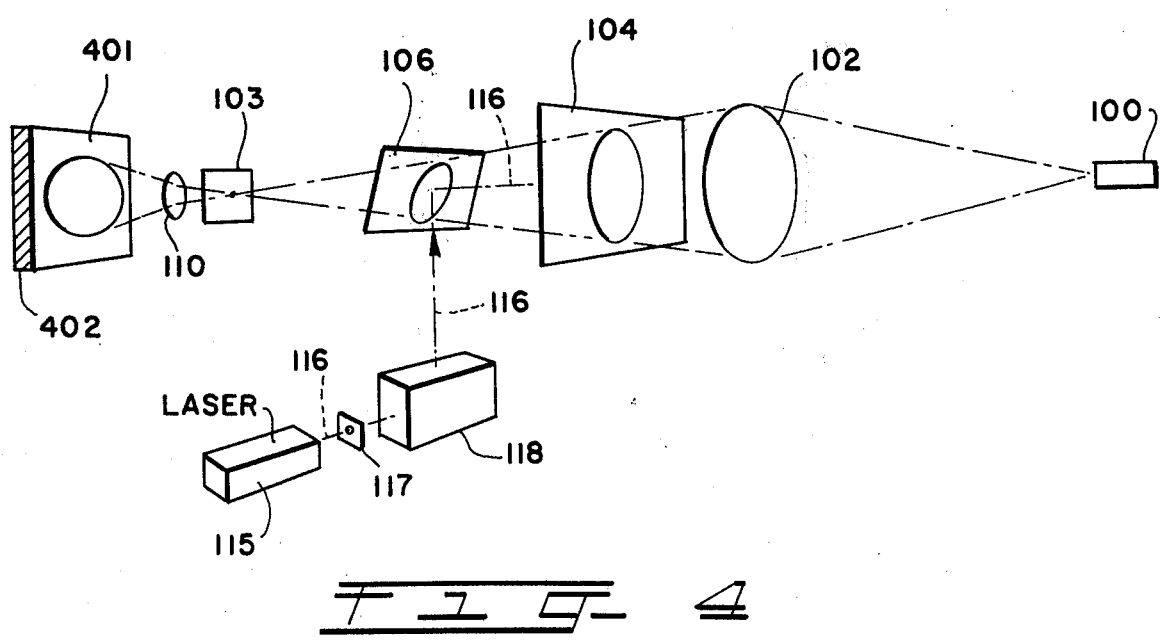
FIG. 4 is a diagram of the projection system of FIG. 1 used to projection pattern a circuit device.

In an alternative embodiment of my invention, the projection system of FIGS. 1 and 2 may be employed to fabricate a circuit device such as a printed circuit board or an integrated circuit, by using only the patterned liquid crystal cell 104 alone. Referring to FIG. 4, the projection system, described above, and comprising viewing light 100, lenses 102 and 110, plate 103, liquid crystal cell 104, reflecting surface 106, laser source 115, modulator 117, and control means 118, is employed. A desired circuit pattern is delineated in cell 104 by selective exposure (molecular disordering) and-/or selective erasure (molecular ordering) of liquid crystal material 205 (FIG. 2) of cell 104, as described above.

After the desired pattern is obtained in cell 104, viewing light 100 is energized and directed towards cell 104. The light passes through cell 104 and those portions of the light scattered by the disoriented portions of cell 104 are blocked by aperture plate 103. The transmitted light passes through projection lens 110 which projects the pattern onto a sensitized layer 401, e.g., a photoresist layer, of a suitable substrate 402, e.g., a $SiO_2$ masked silicon wafer, a copper clad dielectric laminate, etc. The projected pattern of course depends upon the material employed to comprise layer 401, as for example whether an employed photoresist is positive or negative. Also, the light or radiation transmitted and scattered by crystal material 205 will determine the type of radiation or light-sensitive material comprising layer 401, e.g., an ultraviolet radiation sensitive photoresist material sensitive to a certain wavelength of radiant energy.

When layer 401 comprises a photoresist material, depending upon whether the photoresist is positive or negative, portions selectively exposed to the projected light will become less soluble to a solvent to which layer 401 is destined to be exposed (negative resists) or more soluble (positive resists). After exposure, layer 401 is developed, that is, it is exposed to a suitable solvent which removes portions of layer 401 to delineate the desired pattern comprising exposed surface areas of substrate 402. The thus delineated substrate 402, e.g., a copper clad dielectric laminate or a masked semiconductive wafer, is then subjected to a treatment, e.g., etching with a suitable etchant, whereby the exposed areas of substrate 402 are removed. The remaining sensitive layer 401 is then removed, e.g., by exposure to a suitable etchant, thereby yielding substrate 402 having a desired conductive pattern thereof. Thus, the projection system and procedure described above may be employed with photolithographic techniques employed in printed circuit and integrated circuit fabrication, which techniques are well known to those skilled in the art and need not be further elaborated herein. In this regard, reference is made to "A Photoimaging Process for Printed Circuit Manufacture," I. B. Goldman, *Plating*, 47–52, January 1974 and U.S. Pat. No. 3,404,451.

EXAMPLE I

Referring to FIGS. 1 and 2, a liquid crystal cell 104 containing a liquid crystal layer comprising N-(p-cyanobenzylidene)-p-n octylaniline (CBOA) was employed. The liquid crystal layer was about 14 microns in thickness and the cell 104 was one inch wide by one inch in length. The liquid crystal layer was sandwiched between electrodes 203 and 204 which were both coated (at their common surface with the liquid crystal layer) with a silane coupling agent, comprising N,N-dimethyl-N-octadecyl-3-aminopropyltrimethoxysilyl chloride (Dow Corning XZ 2-2300). The coupling agent was applied from a water solution and then cured by drying at 100° C. Electrodes 203 and 204 were made of indium-tin oxide layers having a thickness of about 0.5 to 1.0 micron each. Transparent support substrates 201 and 202 comprised fused silica having a thickness of about 3 millimeters each.

Cell 104 was situated within a conventional oven (not shown in FIG. 1) maintained at a controlled temperature just below 72° C. The liquid crystal layer of cell 104 was initially rendered into a molecular parallel alignment by the application of beam 116 of a 25 milliwatt Nd YAG laser source 115 with the simultaneous application of an electrical field thereto of 11 volts at 10kHz. Thereafter, laser beam 116 was deflected to the desired positions on the surface of cell 104 by control means 118, which comprised a pair of galvanometer controlled mirrors. A light transmitting pattern was thereby obtained to delineate a pattern corresponding to a desired circuit pattern. In order to obtain the desired pattern the Nd YAG laser source 115 provided a focused beam 116 having a cross section of approximately 15 microns. Beam 116 scanned cell 104 at a velocity of about 25 centimeters per second. Portions of cell 104 which had been exposed to beam 116 to obtain light scattering areas were selectively erased by the application of beam 116 thereto with the simultaneous application of an electric field (11 volts at 10kHz) across electrodes 203 and 204, thereby enabling a rapid generation of the desired circuit pattern configuration in cell 204. The circuit pattern generated was that for an 18 × 24 inch multilayer circuit board.

An enlarged image (18 × 24 inch) of the generated pattern was then projected by means of xenon arc lamp 100 which directed visible light through condenser lens 102, through patterned cell 104, through dichroic mirror 106, through projection lens 110. Light scattered by the pattern in cell 104 was removed from the system by Schlieren aperture plate 103 and the projected visible light pattern (non-scattered) then impinged upon sensitive member 112 comprising a photographic silver halide emulsion plate. The light exposed emulsion plate was then developed to form a printed circuit photomask.

The pattern generator described above and in FIG. 1, over an 18 × 24 inch image area, was capable of an address dimension of 1 mil, a positional accuracy of ±1 mil, a minimum linewidth of 10 mils and a feature tolerance of ±1 mil.

What is claimed is:

1. A method of forming a circuit mask which comprises:
   a. heating a selected portion of a cell comprising a liquid crystal above the transition temperature of said crystal to form an artwork master having a pattern formed therein capable of transmitting a desired radiant energy therethrough in an imagewise manner;
   b. positioning a member, having a surface sensitive to said desired radiant energy, in a desired spatial relationship with said master;
   c. exposing said master to said desired radiant energy to transmit said radiant energy through said pattern to form a radiation-exposed pattern on said sensitive surface; and
   d. treating said exposed sensitive surface to form a pattern capable of transmitting radiant energy therethrough to form the circuit mask.

2. The method as defined in claim 1 wherein said heating in step (a) is by means of a laser beam.

3. The method as defined in claim 1 wherein said crystal comprises a smectic crystal.

4. The method as defined in claim 3 wherein said smectic crystal comprises N-(p-cyanobenzylidene)-p-n octylaniline.

5. In an improved method of forming a printed circuit which comprises the steps of:
   a. providing a laminate comprising a dielectric base having a metal layer on at least one surface thereof;
   b. coating the metal layer with a radiation-sensitive material to form a radiation-sensitive layer thereon;
   c. selectively exposing the radiation-sensitive layer to the radiation to form a radiation-exposed pattern thereon;
   d. treating the selectively radiation-exposed layer to remove unwanted portions thereof to form a pattern comprising uncoated portions of the metal layer;
   e. treating the uncoated metal portions to remove them from the dielectric base; and
   f. removing the remaining portions of the radiation-sensitive layer wherein the improvement comprises:
   in step (c), the selectively exposing comprising,
   $a^1$. heating a selected portion of a cell comprising a liquid crystal above the transition temperature of said crystal to form an artwork master having a pattern formed therein capable of transmitting the radiation therethrough in an imagewise manner; and
   $b^1$. exposing said master to the radiation to transmit the radiation through said pattern to form the radiation-exposed pattern on the radiation-sensitive layer.

6. The method as defined in claim 5 wherein said heating in step ($a^1$) is by means of a laser beam.

7. The method as defined in claim 5 wherein said crystal comprises a smectic crystal.

8. The method as defined in claim 7 wherein said smectic crystal comprises N-(p-cyanobenzylidene)-p-n octylaniline.

9. In an improved method of treating a semiconductive wafer, comprising the steps of:
   a. depositing a masking layer on a surface of the semiconductive wafer;
   b. forming a layer sensitive to a desired radiation on the masking layer;
   c. selectively exposing the radiation-sensitive layer to the desired radiation to form a radiation-exposed pattern thereon;
   d. treating the radiation-sensitive layer to remove a portion thereof to expose an underlying surface area of the masking layer; and
   e. removing the underlying surface area to expose the underlying semiconductive surface area of the wafer, wherein the improvement comprises:
   in step (c), the selectively exposing comprising
   $a^1$. heating a selected portion of a cell comprising a liquid crystal above the transition temperature of said crystal to form an artwork master having a pattern formed therein capable of transmitting the radiation therethrough in an imagewise manner; and
   $b^1$. exposing said master to the radiation to transmit the radiation through said pattern to form the radiation-exposed pattern on the radiation-sensitive layer.

10. The method as defined in claim 9 wherein said heating in step ($a^1$) is by means of a laser beam.

11. The method as defined in claim 9 wherein said crystal comprises a smectic crystal.

12. The method as defined in claim 11 wherein said crystal comprises N-(p-cyanobenzylidene)-p-n-octylaniline.

* * * * *